(12) United States Patent
Yang (10) Patent No.: US 8,347,155 B2
(45) Date of Patent: Jan. 1, 2013

(54) SYSTEMS AND METHODS FOR PREDICTING FAILURE OF A STORAGE MEDIUM

(75) Inventor: Shaohua Yang, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 572 days.

(21) Appl. No.: 12/425,824

(22) Filed: Apr. 17, 2009

(65) Prior Publication Data

US 2010/0268996 A1   Oct. 21, 2010

(51) Int. Cl.
*G11C 29/14* (2006.01)
*G11C 29/50* (2006.01)

(52) U.S. Cl. ........................ 714/719; 714/733

(58) Field of Classification Search .................. None
See application file for complete search history.

(56) References Cited

U.S. PATENT DOCUMENTS

| | | | |
|---|---|---|---|
| 6,065,149 A | 5/2000 | Yamanaka | |
| 6,404,891 B1 * | 6/2002 | Seitz et al. | 381/107 |
| 6,691,263 B2 | 2/2004 | Vasic et al. | |
| 6,738,948 B2 | 5/2004 | Dinc et al. | |
| 6,831,574 B1 * | 12/2004 | Mills et al. | 341/50 |
| 6,980,382 B2 | 12/2005 | Hirano et al. | |
| 7,154,936 B2 | 12/2006 | Bjerke et al. | |
| 7,168,030 B2 | 1/2007 | Aryoshi | |
| 7,203,015 B2 | 4/2007 | Sakai et al. | |
| 7,237,173 B2 | 6/2007 | Morita et al. | |
| 7,254,192 B2 | 8/2007 | Onggosanusi | |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,688,915 B2 | 3/2010 | Tanriku et al. | |
| 8,018,902 B2 * | 9/2011 | Wintzell | 370/332 |
| 2002/0060868 A1 * | 5/2002 | Lenny et al. | 360/31 |
| 2003/0063405 A1 | 4/2003 | Jin et al. | |
| 2004/0177308 A1 | 9/2004 | Kim et al. | |
| 2006/0090098 A1 | 4/2006 | Le et al. | |
| 2007/0041120 A1 | 2/2007 | Komatsu | |

(Continued)

FOREIGN PATENT DOCUMENTS

JP           07093899 A  *  4/1995

(Continued)

OTHER PUBLICATIONS

U.S. Appl. No. 12/425,626, filed Apr. 17, 2009, Weijun Tan.

(Continued)

*Primary Examiner* — Ajay Bhatia
*Assistant Examiner* — Dipakkumar Gandhi
(74) *Attorney, Agent, or Firm* — Hamilton DeSantis & Cha (57) ABSTRACT

Various approaches for determining storage medium health. For example, a storage device is disclosed that includes a storage medium and a data processing circuit. The data processing circuit receives a data set derived from the storage medium. The data processing circuit includes a data detector circuit, a data decoder circuit, and a health detection circuit. The data detector circuit receives the data set and provides a detected output. The data decoder circuit receives a derivative of the detected output and provides a decoded output. The health detection circuit receives an indication of a number of times that the data set is processed through the combination of the data detector circuit and the data decoder circuit, and generates an indirect health status of the storage medium using the number of times that the data set is processed through the combination of the data detector circuit and the data decoder circuit.

20 Claims, 5 Drawing Sheets

U.S. PATENT DOCUMENTS

| | | | |
|---|---|---|---|
| 2007/0061687 A1 | 3/2007 | Hwang | |
| 2007/0263440 A1* | 11/2007 | Cornwell et al. | 365/185.03 |
| 2008/0115036 A1 | 5/2008 | Kuznetsov et al. | |
| 2009/0235116 A1 | 9/2009 | Tan et al. | |
| 2009/0235146 A1 | 9/2009 | Tan et al. | |
| 2009/0268575 A1 | 10/2009 | Tan et al. | |
| 2009/0268848 A1 | 10/2009 | Tan et al. | |
| 2009/0271670 A1 | 10/2009 | Tan et al. | |
| 2010/0042877 A1 | 2/2010 | Tan | |
| 2010/0074078 A1 | 3/2010 | Cao | |

FOREIGN PATENT DOCUMENTS

| | | |
|---|---|---|
| JP | 10-145243 | 5/1998 |
| JP | 2007-087529 | 4/2007 |
| WO | WO 2004/112288 | 12/2004 |
| WO | WO 2007/001305 | 1/2007 |

OTHER PUBLICATIONS

U.S. Appl. No. 12/399,679, filed Mar. 6, 2009, Dziak, Scott.
U.S. Appl. No. 12/399,713, filed Mar. 6, 2009, Weijun Tan.
U.S. Appl. No. 12/399,750, filed Mar. 6, 2009, Weijan Tan.
Kavcic et al., "A Signal-Dependent Autoregressive Channel Model", IEEE Transactions on Magnetics, vol. 35, No. 5, Sep. 1999 pp. 2316-2318.
Galbraith et al: "Iterative Detection Read Channel Technology in Hard Disk Drives", Hitachi Oct. 2008 p. 4PP Retrieved from the internet URL: http://www.hitachigst.com/te.
Hughes, et al: "Improved Disk-Drive Failure Warnings", IEEE Transactions on Reliability, vol. 51, No. 3 Sep. 2002 pp. 350-357 Piscataway, NJ, USA Retrieved from the int.

* cited by examiner

SYSTEMS AND METHODS FOR PREDICTING FAILURE OF A STORAGE MEDIUM

BACKGROUND OF THE INVENTION

The present inventions are related to systems and methods for determining the health of a storage medium, and more particularly to systems and methods for indirectly predicting potential failures of a storage medium.

A typical storage device includes a storage medium where information is stored for retrieval at a later point. Over time, the storage medium and/or other circuits and modules of the storage device may degrade leading to possible failures. For hard disk drives, failure rates are often discussed as sector failure rates with an acceptable failure rate being less than $e^{-15}$. Such small failure rates are often difficult to detect, and even where detectable, often require an extended period of time for measurement. In some cases, this extended period makes determination of possible failure impractical.

Hence, for at least the aforementioned reasons, there exists a need in the art for advanced systems and methods for predicting failure of a storage medium.

BRIEF SUMMARY OF THE INVENTION

The present inventions are related to systems and methods for determining the health of a storage medium, and more particularly to systems and methods for indirectly predicting potential failures of a storage medium.

Various embodiments of the present invention provide storage devices that include a storage medium and a data processing circuit. The data processing circuit receives a data set derived from the storage medium. The data processing circuit includes a data detector circuit, a data decoder circuit, and a health detection circuit. The data detector circuit receives the data set and provides a detected output. The data decoder circuit receives a derivative of the detected output and provides a decoded output. In some cases, the derivative of the detected output is an interleaved version of the detected output. The health detection circuit receives an indication of a number of times that the data set is processed through the combination of the data detector circuit and the data decoder circuit. The health detection circuit generates an indirect health status of the storage medium based at least in part on the number of times that the data set is processed through the combination of the data detector circuit and the data decoder circuit. This combination of processing through the combination may be referred to as a global iteration.

In some instances of the aforementioned embodiments, the health detection circuit includes a global loop counter that is incremented when the data set is processed through the combination of the data detector circuit and the data decoder circuit. In such cases, the number of times that the data set is processed through the combination of the data detector circuit and the data decoder circuit is a global loop count value provided by the global loop counter. In various cases, the indirect health status of the storage medium includes a mean of the global loop count value derived after processing a plurality of data sets. In particular cases, the mean of the global loop count value is calculated in accordance with the following equation:

$$\text{Global\_Mean}(i+1) = \text{Global\_Mean}(i) + \mu(\text{GlobalLoopCount} - \text{Global\_Mean}(i)),$$

where i indicates an instant in time corresponding to a global loop count value and $\mu$ is a scalar value.

In one or more instances of the aforementioned embodiments, the data decoder circuit is operable to process the data set a plurality of times in sequence. In such cases, the health detection circuit may include a local loop counter that is incremented when the data set is processed through the data decoder circuit. In some such cases, the health detection circuit receives an indication of a number of times that the data set is processed through the data decoder circuit, and the health detection circuit generates an indirect health status of the storage medium based at least in part on the number of times that the data set is processed through the data decoder circuit. The number of times that the data set is processed through the data decoder circuit is a local loop count value provided by the local loop counter. In some cases, the indirect health status of the storage medium includes a mean of the local loop count value derived after processing a plurality of data sets. In such cases, the mean of the local loop count value may be calculated in accordance with the following equation:

$$\text{Local\_Mean}(i+1) = \text{Local\_Mean}(i) + \mu(\text{LocalLoopCount} - \text{Local\_Mean}(i)),$$

where i indicates an instant in time corresponding to a local loop count value and $\mu$ is a scalar value.

Other embodiments of the present invention provide storage devices that include a storage medium and a data processing circuit. The data processing circuit receives a data set derived from the storage medium. The data processing circuit includes: a data decoder circuit and a health detection circuit. The data decoder circuit receives a derivative of the data set and provides a decoded output. The data decoder circuit is operable to process the derivative of the data set a plurality of times in sequence. The health detection circuit receives an indication of a number of times that the data set is processed through the data decoder circuit, and the health detection circuit generates an indirect health status of the storage medium based at least in part on the number of times that the data set is processed through the data decoder circuit. In some cases, the health status circuit includes a local loop counter that is incremented when the data set is processed through the data decoder circuit. The number of times that the data set is processed through the data decoder circuit is a local loop count value provided by the local loop counter. In particular cases, the indirect health status of the storage medium includes a mean of the local loop count value derived after processing a plurality of data sets.

In various instances of the aforementioned embodiments, the data processing circuit further includes a data detector circuit. The data detector circuit receives the data set and provides a detected output. In such cases, the derivative of the data set is a derivative of the detected output. In some cases, the health detection circuit includes a global loop counter that is incremented when the data set is processed through the combination of the data detector circuit and the data decoder circuit. The number of times that the data set is processed through the combination of the data detector circuit and the data decoder circuit is a global loop count value provided by the global loop counter. In such cases, the indirect health status of the storage medium includes a mean of the global loop count value derived after processing a plurality of data sets.

Yet other embodiments of the present invention provide data processing circuits that include: a first data detector circuit, a second data detector circuit, a data decoder circuit, and a health detection circuit. The first data detector circuit is operable to perform a data detection on a first input data set at a first time and on a second input data set at a second time. The first input data set and the second input data set are derived from a storage medium. The data decoder circuit is operable to receive a derivation of an output from the first data detector circuit corresponding to the first data set, an output from the first data detector circuit corresponding to the second data set, and a derivation of an output from the second data detector circuit. The data decoder circuit is further operable to process a given data set a plurality of times in sequence. The second data detector circuit is operable to perform a data detection on the first input data set using the output of the data decoder circuit corresponding to the first input data set at a third time only if the output of the decoder failed to converge. The third time is subsequent to the first time and to the second time. The health detection circuit receives an indication of a number of times that the data set is processed through the data decoder circuit, and generates an indirect health status of the storage medium based at least in part on the number of times that the data set is processed through the data decoder circuit.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for determining the health of a storage medium, and more particularly to systems and methods for indirectly predicting potential failures of a storage medium.

Figure 1:
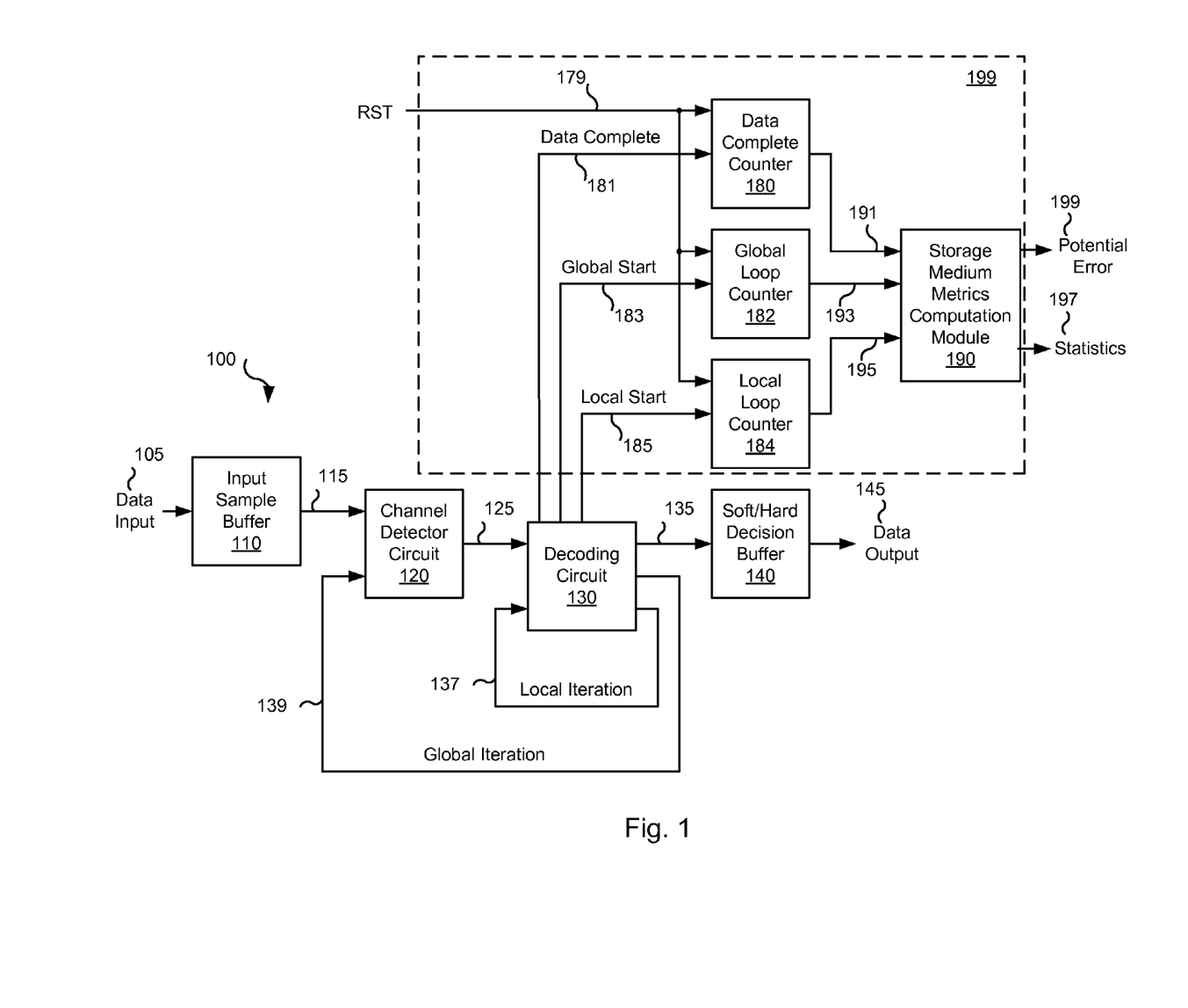
FIG. 1 shows a data processing circuit including an indirect storage medium failure mechanism in accordance with some embodiments of the present invention.

Turning to FIG. 1, a data processing circuit 100 including an indirect storage medium failure mechanism 199 is shown in accordance with some embodiments of the present invention. Data processing circuit 100 includes an input sample buffer 110 that receives a data input 105. In some cases, data input 105 is a series of data samples representing a sector of data sensed from a storage medium. Based upon the disclosure provided herein, one of ordinary skill in the art will recognize other data inputs and sources thereof that may be used in relation to different embodiments of the present invention. A sample output 115 is provided by input sample buffer 110 to a channel detector circuit 120. Channel detector circuit 120 may be any channel detector known in the art. As an example, channel detector circuit 120 may be a soft output Viterbi algorithm (SOVA) detector as are known in the art. Based upon the disclosure provided herein, one of ordinary skill in the art will recognize other channel detectors that may be used in relation to different embodiments of the present invention.

Channel detector circuit 120 provides a detected output 125 corresponding to data input 105. Detected output 125 is provided to a decoding circuit 130. Decoding circuit 130 may be any decoding circuit known in the art. As an example, decoding circuit 130 may be a low density parity check (LDPC) decoder as are known in the art. Based upon the disclosure provided herein, one of ordinary skill in the art will recognize other decoders that may be used in relation to different embodiments of the present invention. Decoding circuit 130 provides a decoded output 135 to a soft/hard decision buffer 140. Decoded output 135 may include both soft and hard decision information as is known in the art. Soft/hard decision buffer may be any memory buffer that is capable of receiving soft and/or hard decision in preparation for providing a data output 145. In some cases, decoded output 135 is provided to soft/hard decision buffer 140 when either decoding circuit 130 converges or a maximum number of iterations for data input 105 has been performed. In addition to providing decoded output 135 to soft/hard decision buffer 140, decoding circuit 130 pulses data complete signal 181 when decoded output 135 is provided.

Where processing of data input 105 fails to converge, one or more additional iterations may be performed in sequence by decoding circuit 130 using a local iteration feedback loop 137. Any time another local iteration is performed, a local start signal 185 is pulsed by decoding circuit 130. After a maximum number of local iterations, a decoded data output may be passed back to channel detector circuit 120 using a local iteration feedback loop 139 when the processing of data input 105 still fails to converge. Any time another global iteration is performed, a global start signal 183 is pulsed by decoding circuit 130. As there will always be at least one iteration through decoding circuit 130, local start signal 185 may not be pulsed for the first pass through decoding circuit, but only pulsed for each successive iteration. Alternatively, local start signal 185 may be pulsed for each iteration, with the additional count mathematically accounted for downstream.

A data complete counter 180 is incremented each time data complete signal 181 is pulsed. Further, data complete counter 180 is reset whenever a reset signal 179 is asserted. A global loop counter 182 is incremented each time global start signal 183 is pulsed. Further, global loop counter 182 is reset whenever reset signal 179 is asserted. A local loop counter 184 is incremented each time local start signal 185 is pulsed. Further, local loop counter 182 is reset whenever reset signal 179 is asserted.

A data complete value 191 from data complete counter 180, a global loop count value 193 from global loop counter 182, and a local loop count value 195 from local loop counter 184 are provided to a storage medium metrics computation module 190. Storage medium metrics computation module 190 uses the aforementioned count values to predict a potential failure of a medium from which data input 105 is derived. Further, storage medium metrics computation module 190 provides various statistics 197 that may be used to discern the health of a medium from which data input 105 is derived. Such statistics may include, for example, the mean number of times that a data set passes through a global loop (i.e., a channel detector circuit 120 and decoding circuit 130), and the mean number of times that a data set passes through a local loop (i.e., decoding circuit 130). The value of the aforementioned means may be calculated using, for example, histogramming, averaging, or least mean squared error method. As an example, the means may be calculated in accordance with the following equations:

Global_Mean($i$+1)=Global_Mean($i$)+μ(GlobalLoopCount193−Global_Mean($i$));

Local_Mean($i$+1)=Local_Mean($i$)+μ(LocalLoopCount195−Local_Mean($i$));

where i indicates an instant in time where the values are calculated and μ is a small scalar value that is selected to limit the change that can occur at any time. The aforementioned equations assume that data complete counter 180, global loop counter 182 and local loop counter 184 are reset at the end of processing for each data set. Thus, for example, reset 179 may be asserted at the end of processing a sector of data and after the respective count values are retrieved. In such cases, local start signal 185 is not pulsed for the first local iteration through decoding circuit 130. In some embodiments of the present invention, the means are calculated each time data complete signal 181 is pulsed (i.e., at the end of processing each data set received via data input 105. As another example, the means may be calculated as simple averages in accordance with the following equations:

$$Global\_Mean(i) = \frac{GlobalLoopCount193}{DataCompleteCount191};$$

$$Local\_Mean(i) = \frac{LocalLoopCount195}{DataCompleteCount191};$$

where i indicates an instant in time where the values are calculated. For these equations, the count values from data complete counter 180, global loop counter 182 and local loop counter 184 are not necessarily reset at the end of processing of a data set.

Figure 2A:
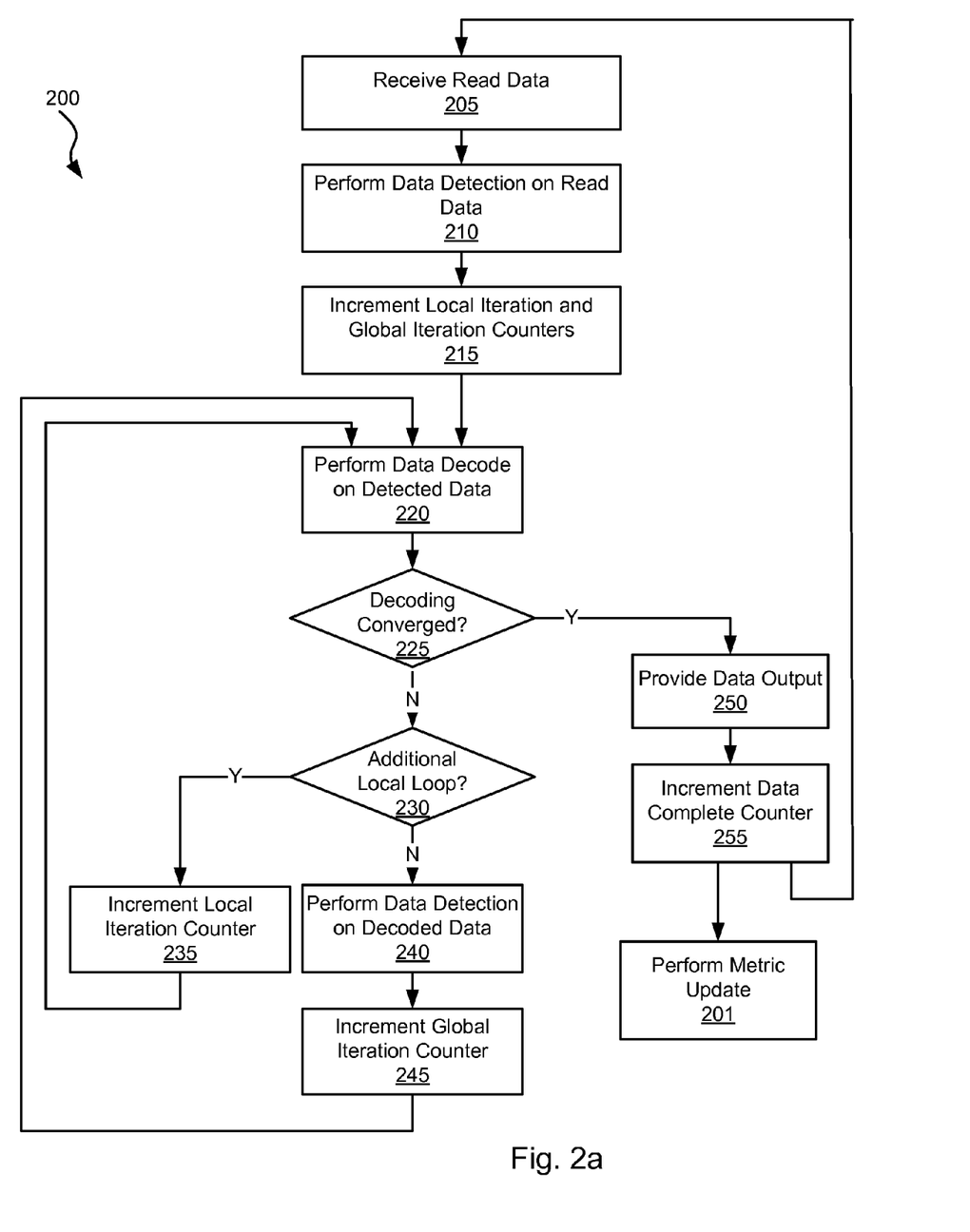
FIGS. 2a-2b are flow diagrams showing methods for indirect storage medium failure in a data processing system in accordance with various embodiments of the present invention.

Turning to FIG. 2a, a flow diagram 200 shows a method for obtaining various metrics that can be used for indirectly predicting storage medium failure in accordance with various embodiments of the present invention. Following flow diagram 200, a read data set is received (block 205). In some cases, the read data set is a sector of data derived from a storage medium. Based upon the disclosure provided herein, one of ordinary skill in the art will recognize a variety of data sets that may be processed in accordance with different embodiments of the present invention. A data detection process is performed on the read data (block 210). This data detection process may be any data detection known in the art such as, for example, a soft output Viterbi algorithm data detection. It should be noted that other channel detectors may be used in relation to different embodiments of the present invention. A local iteration count and a global iteration count are incremented indicating that at least one pass through the detection process and one pass through the decoding process are guaranteed to complete (block 215).

A data decode is performed on the output from the data detector (block 220). The data decode may be done using any decoding algorithm known in the art. For example, the data decode may be done using an LDPC decoder. It is then determined whether the decoding process converged (i.e., resulted in the correct output) (block 225). Where the decoding process failed to converge (block 225), it is determined whether another local loop through the decoding circuit is to be used (block 230). This may be determined using determination mechanisms existing in the art. Where an additional local loop through the decoding process is to be performed (block 230), the local iteration counter is incremented to indicate the additional local loop (block 235) and the processes of blocks 220 through 230 are repeated using the output from the decoding process.

Alternatively, where an additional loop through the decoding process is not called for (block 230), the decoded data is provided to the data detector for performance of another data detection process (block 240). In addition to performing the data detection (block 240), the global iteration counter is incremented indicating another global loop (block 245). The processes of blocks 220 through 230 are then repeated.

Where the data converges (or a timeout condition is exceeded) (block 225), the data resulting from the decoding process is provided as a data output (block 250), and the data complete count is incremented indicating a concluded data set (block 255). With the new metrics (global iteration count, local iteration count, and data complete count), a metric update process is performed (block 201). The metric update process includes mathematically calculating various statistics and determining whether an increased potential for failure of the storage medium exists.

Figure 2B:
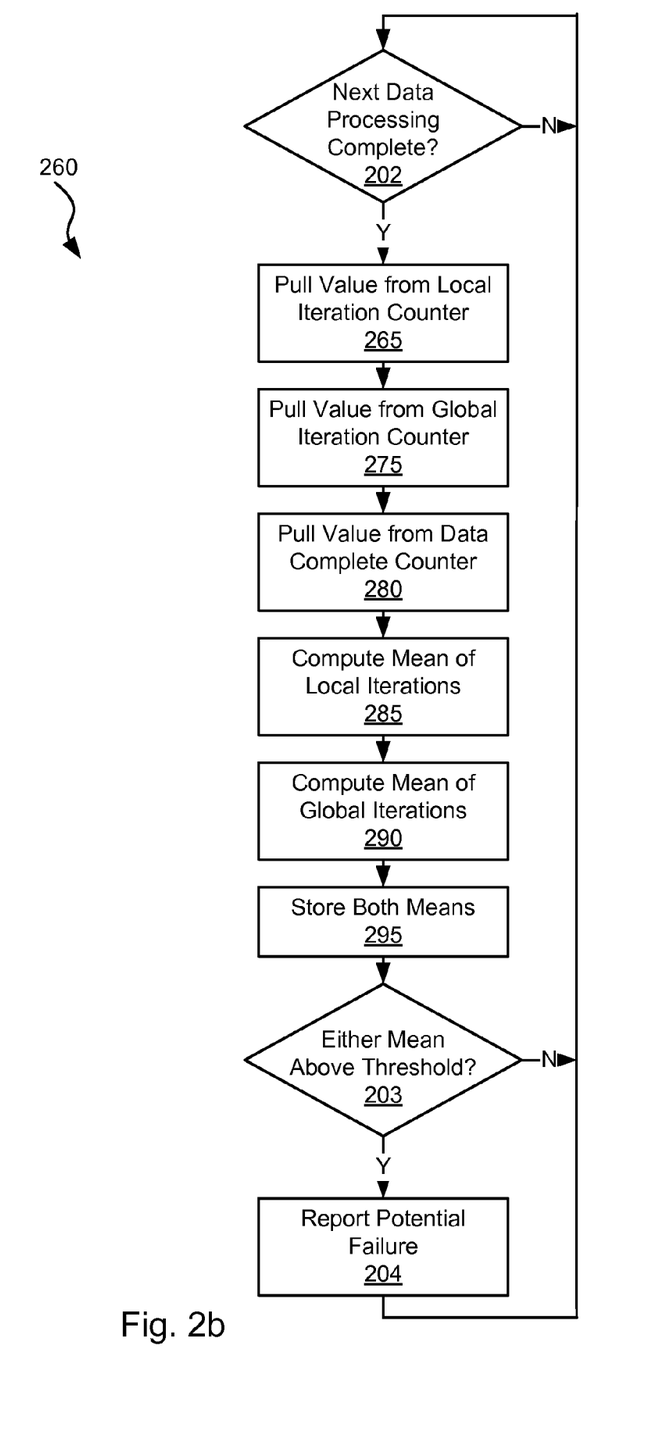

Turning to FIG. 2b, a flow diagram 260 shows a method for performing the metric update process of block 201 of FIG. 2a in accordance with various embodiments of the present invention. Following flow diagram 260, it is determined if the next data processing has completed (block 202). In some cases, this block is essentially the same as blocks 225 through 255 of FIG. 2a. Where the next data processing is complete (block 202), the local iteration count value from local iteration counter is pulled (block 265), the global iteration count value from the global iteration counter is pulled (block 275), and the data complete value from the data complete counter is pulled (block 280).

Using the aforementioned information, the mean of local iterations (block 285) and the mean of global iterations (block 290) are both calculated. The value of the aforementioned means may be calculated using, for example, histogramming, averaging, or least mean squared error method. As an example, the means may be calculated in accordance with the following equations:

Global_Mean($i$+1)=Global_Mean($i$)+μ(GlobalLoopCount−Global_Mean($i$));

Local_Mean($i$+1)=Local_Mean($i$)+μ(LocalLoopCount−Local_Mean($i$));

where i indicates an instant in time where the values are calculated and μ is a small scalar value that is selected to limit the change that can occur at any time. In some embodiments of the present invention, the means are calculated each time a data set completes processing. As another example, the means may be calculated as simple averages in accordance with the following equations:

$$Global\_Mean(i) = \frac{GlobalLoopCount}{DataCompleteCount};$$

$$Local\_Mean(i) = \frac{LocalLoopCount}{DataCompleteCount};$$

where i indicates an instant in time where the values are calculated.

Both of the means are then stored to memory (block 295). As such, the means may be accessed by any other process that may find use for them. It is then determined whether either of the calculated means is above a defined threshold (block 203). Where it is found that one or both of the mean values are above a defined threshold value (block 203), a potential failure is indicated (block 204). This report of a potential failure may be provided as, for example, an interrupt to a processor controlling access to the storage medium. In some cases, such an interrupt may cause a status check of the storage medium.

Figure 3:
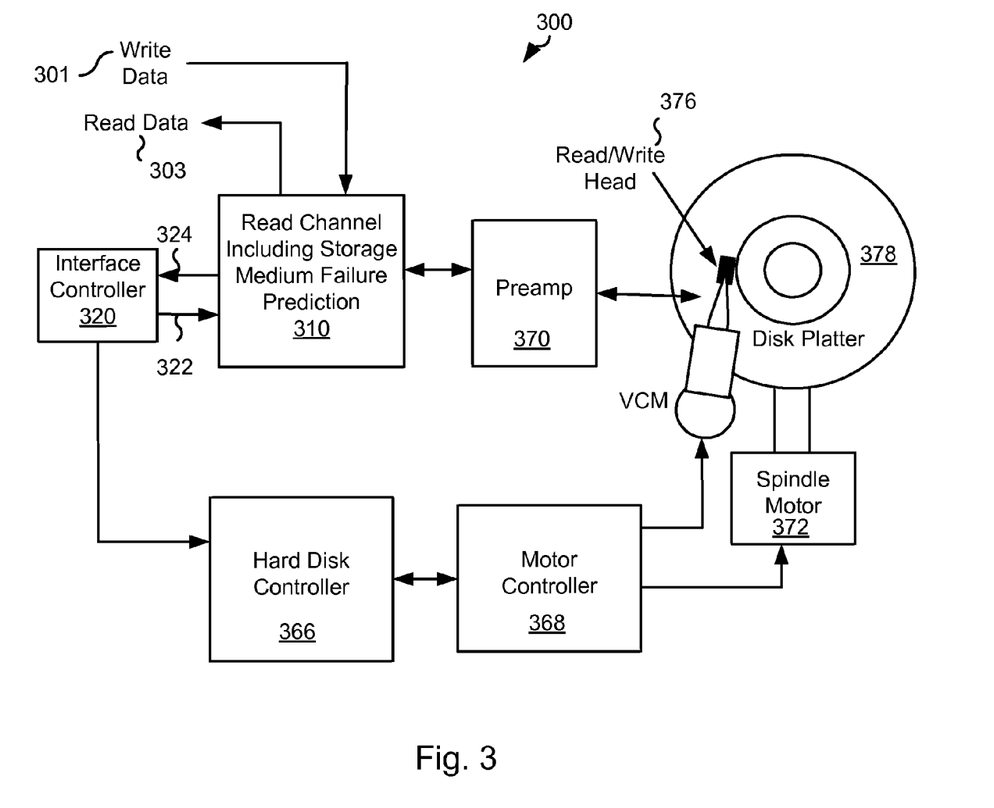
FIG. 3 shows a storage system with an indirect storage medium failure mechanism in accordance with one or more embodiments of the present invention.

Turning to FIG. 3, a storage system 300 including a read channel circuit 310 with an indirect storage medium failure mechanism is shown in accordance with one or more embodiments of the present invention. Storage system 300 may be, for example, a hard disk drive. The indirect storage medium failure mechanism included as part of read channel 310 may be, but is not limited to, the system discussed in relation to FIG. 1. In some cases, the indirect storage medium failure mechanism included as part of read channel 310 may operate using the method described above in relation to FIGS. 2a-2b.

Storage system 300 also includes a preamplifier 370, an interface controller 320, a hard disk controller 366, a motor controller 368, a spindle motor 372, a disk platter 378, and a read/write head 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with a perpendicular recording scheme. For example, the magnetic signals may be recorded as either longitudinal or perpendicular recorded signals.

In a typical read operation, read/write head assembly 376 is accurately positioned by motor controller 368 over a desired data track on disk platter 378. The appropriate data track is defined by an address received via interface controller 320. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel module 364 via preamplifier 370. Preamplifier 370 is operable to amplify the minute analog signals accessed from disk platter 378. In turn, read channel module 310 decodes and digitizes the received analog signal to recreate the information originally written to disk platter 378. A write operation is substantially the opposite of the preceding read operation with write data 301 being provided to read channel module 310. This data is then encoded and written to disk platter 378.

Figure 4:
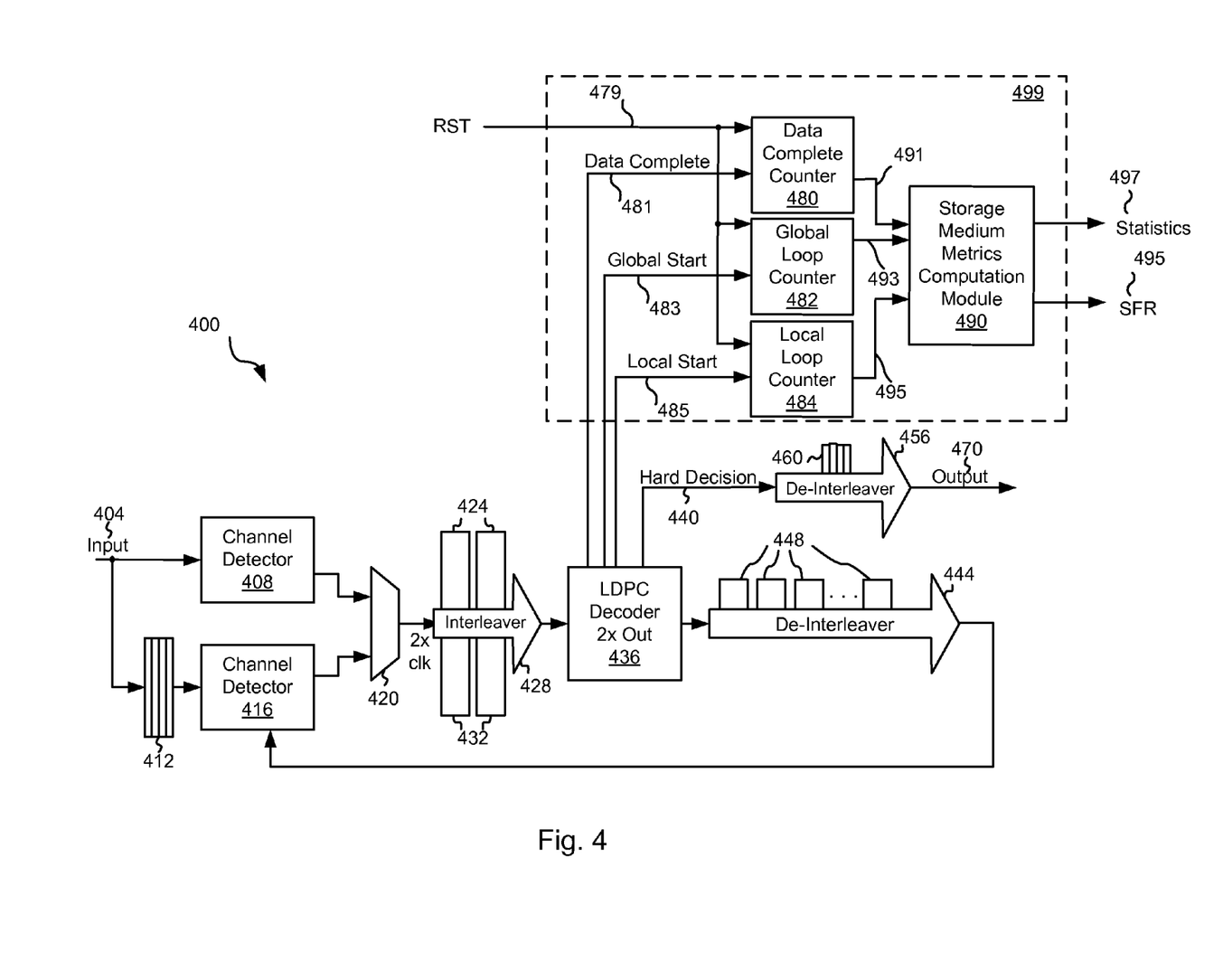
FIG. 4 depicts another data processing circuit including an indirect storage medium failure mechanism in accordance with some embodiments of the present invention.

Turning to FIG. 4, another data processing circuit 400 including an indirect storage medium failure mechanism 499 (i.e., a health detection circuit) is shown in accordance with some embodiments of the present invention. Along with indirect storage medium failure mechanism 499, data processing circuit 400 includes a data input 404 that is fed to a channel detector 408. Channel detector 408 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 404 is provided to an input data buffer 412 that is designed to hold a number of data sets received from data input 404. In some embodiments of the present invention, such data sets are a sector of data from a storage medium. The size of input data buffer 412 may be selected to provide sufficient buffering such that a data set input via data input 404 remains available at least until a first iteration processing of that same data set is complete and the processed data is available in a ping pong buffer 448 (i.e., a queuing buffer) as more fully described below. Input data buffer 412 provides the data sets to a channel detector 416. Similar to channel detector 408, channel detector 416 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 408 and channel detector 416 are provided to an interleaver circuit 428 via a multiplexer 420. Such outputs may be, for example, log likelihood ratio values. Interleaver circuit 428 interleaves the output of channel detector 408 and separately interleaves the output of channel detector 416 using two ping pong buffers 424, 432. One of the buffers in ping pong buffer 424 holds the result of a prior interleaving process of the output from channel detector 408 and is unloaded to an LDPC decoder 436, while the other buffer of ping pong buffer 424 holds a data set from channel detector 408 that is currently being interleaved. Similarly, one of the buffers in ping pong buffer 432 holds the result of a prior interleaving process of the output from channel detector 416 and is unloaded to LDPC decoder 436, while the other buffer of ping pong buffer 424 holds a data set from channel detector 416 that is currently being interleaved.

LDPC decoder 436 is capable of decoding one or more data sets simultaneously. As an example, LDPC decoder 436 may be designed to decode an interleaved data set from ping pong buffer 424, or an interleaved data set from ping pong buffer 432, or to decode interleaved data sets from ping pong buffer 424 and ping pong buffer 432 simultaneously. The decoded data is either provided as a hard decision output 440 and/or to a de-interleaver circuit 444 that uses ping pong buffer 448 to de-interleave the decoded data and to provide the de-interleaved data as an input to channel detector 416. One of the buffers in ping pong buffer 448 holds the result of a prior de-interleaving process and is unloaded to channel detector 416, while the other buffer of ping pong buffer 448 holds a decoded data set currently being de-interleaved. Hard decision output 440 is provided to a de-interleaver circuit 456 that de-interleaves hard decision output 440 and stores the de-interleaved result in an output data buffer 460. Ultimately, de-interleaver circuit 456 provides the de-interleaved data stored in output data buffer 460 as an output 470. Hard output 440 is provided from LDPC decoder 436 whenever the data processed by LDPC decoder 436 converges or whenever there is insufficient buffering in output data buffer 460.

LDPC decoder 436 is capable of performing one or more local iterations (i.e., processing through LDPC decoder 436). Each time one of the local iterations is started, LDPC decoder 436 pulses a local start signal 485. Further, each time decoded data is placed in ping pong buffer 448 requiring another pass through channel detector 416 and LDPC decoder 436, a global start signal 483 is pulsed by LDPC decoder 436. In addition, each time hard decision data 440 is provided to output data buffer 460, a data complete signal 481 is pulsed by LDPC decoder 436. Indirect storage medium failure mechanism 499 includes a data complete counter 480 that is incremented each time data complete signal 481 is pulsed. Further, data complete counter 480 is reset whenever a reset signal 479 is asserted. A global loop counter 482 is incremented each time global start signal 483 is pulsed. Further, global loop counter 482 is reset whenever reset signal 479 is asserted. A local loop counter 484 is incremented each time local start signal 485 is pulsed. Further, local loop counter 482 is reset whenever reset signal 479 is asserted.

A data complete value 491 from data complete counter 480, a global loop count value 493 from global loop counter 482, and a local loop count value 495 from local loop counter 484 are provided to a storage medium metrics computation module 490. Storage medium metrics computation module 490 uses the aforementioned count values to predict a potential failure of a medium from which data input 404 is derived. Further, storage medium metrics computation module 490 provides various statistics 497 that may be used to discern the health of a medium from which data input 404 is derived. Such statistics may include, for example, the mean number of times that a data set passes through a global loop (i.e., a channel detector circuit 408/416 and LDPC decoder circuit 436), and the mean number of times that a data set passes through a local loop (i.e., decoding circuit 436). The value of the aforementioned means may be calculated using, for example, histogramming, averaging, or least mean squared error method. As an example, the means may be calculated in accordance with the following equations:

$$\text{Global\_Mean}(i+1) = \text{Global\_Mean}(i) + \mu(\text{GlobalLoopCount}493 - \text{Global\_Mean}(i));$$

$$\text{Local\_Mean}(i+1) = \text{Local\_Mean}(i) + \mu(\text{LocalLoopCount}495 - \text{Local\_Mean}(i));$$

where i indicates an instant in time where the values are calculated and μ is a small scalar value that is selected to limit the change that can occur at any time. In some embodiments of the present invention, the means are calculated each time data complete signal 481 is pulsed (i.e., at the end of processing each data set received via data input 404. As another example, the means may be calculated as simple averages in accordance with the following equations:

$$\text{Global\_Mean}(i) = \frac{GlobalLoopCount493}{DataCompleteCount491};$$

$$\text{Local\_Mean}(i) = \frac{LocalLoopCount495}{DataCompleteCount491};$$

where i indicates an instant in time where the values are calculated. Indirect storage medium failure mechanism 499 is operable to provide statistics 497 indicating operational status of data processing circuit 400 and indirectly indicating the health of a medium from which input 404 is derived.

Of note, a number of local loop iterations and/or global loop iterations may be used for decoding each data set (e.g., each data sector of a storage medium). A count of the number of loops executed for each data set is maintained individually. This allows for a determination of the health of the particular region from which the data set is taken. Such individual data set counters can be realized for storing count values with the data set to which they correspond in ping pong buffer 448. When the data is again pulled from ping pong buffer 448 for additional processing, the count values associated with the respective data set are loaded into the counters (i.e., global loop counter 482 and local loop counter 484) and are incremented in accordance with any additional processing that is applied. Where the data set is to be processed further, it is put back into ping pong buffer 448. At that time, the global loop values and the local loop value are also put back into a corresponding location in ping pong buffer 448. When the data set is finally written out as hard decision data 440, the accumulated local loop count and global loop count are tested to provide statistics associated with the location on the storage medium from which the particular data set was derived. This process of accumulating global and local loop counts is repeated for each data set individually.

It should be noted that a similar storage medium failure mechanism 499 may be applied to other data processing circuits. For example, a storage medium failure mechanism 499 generating the various statistics may be applied to the data processing circuits disclosed in U.S. patent application Ser. No. 12/114,462 entitled "Systems and Methods for Queue Based Data Detection and Decoding", and filed May 2, 2008 by Yang et al. The entirety of the aforementioned patent application is incorporated herein by reference for all purposes.

In conclusion, the invention provides novel systems, devices, methods and arrangements for determining storage medium health. While detailed descriptions of one or more embodiments of the invention have been given above, various alternatives, modifications, and equivalents will be apparent to those skilled in the art without varying from the spirit of the invention. Further, techniques discussed herein may be applied to analog to digital converters as well. Therefore, the above description should not be taken as limiting the scope of the invention, which is defined by the appended claims.

What is claimed is:

1. A storage device, wherein the storage device comprises:
a storage medium; and
a data processing circuit, wherein the data processing circuit is operable to receive a data set derived from the storage medium, and wherein the data processing circuit includes:
a data detector circuit, wherein the data detector circuit is operable to receive the data set and to provide a detected output;
a data decoder circuit, wherein the data decoder circuit is operable to receive a derivative of the detected output and to provide a decoded output; and
a health detection circuit, wherein the health detection circuit is operable to receive an indication of a number of times that the data set is processed through the combination of the data detector circuit and the data decoder circuit, and wherein the health detection circuit is operable to generate an indirect health status of the storage medium based at least in part on the number of times that the data set is processed through the combination of the data detector circuit and the data decoder circuit.

2. The storage device of claim 1, wherein the health detection circuit includes a global loop counter that is operable to increment when the data set is processed through the combination of the data detector circuit and the data decoder circuit, and wherein the number of times that the data set is processed through the combination of the data detector circuit and the data decoder circuit is a global loop count value provided by the global loop counter.

3. The storage device of claim 2, wherein the indirect health status of the storage medium includes a mean of the global loop count value derived after processing a plurality of data sets.

4. The storage device of claim 3, wherein the mean of the global loop count value is calculated in accordance with the following equation:

$$\text{Global\_Mean}(i+1) = \text{Global\_Mean}(i) + \mu(\text{GlobalLoopCount} - \text{Global\_Mean}(i)),$$

where i indicates an instant in time corresponding to a global loop count value and $\mu$ is a scalar value.

5. The storage device of claim 2, wherein the data decoder circuit is operable to process the data set a plurality of times in sequence, and wherein the health detection circuit includes a local loop counter that is operable to increment when the data set is processed through the data decoder circuit.

6. The storage device of claim 5, wherein the health detection circuit is operable to receive an indication of a number of times that the data set is processed through the data decoder circuit, and wherein the health detection circuit generates an indirect health status of the storage medium based at least in part on the number of times that the data set is processed through the data decoder circuit, and wherein the number of times that the data set is processed through the data decoder circuit is a local loop count value provided by the local loop counter.

7. The storage device of claim 6, wherein the indirect health status of the storage medium includes a mean of the local loop count value derived after processing a plurality of data sets.

8. The storage device of claim 7, wherein the mean of the local loop count value is calculated in accordance with the following equation:

$$\text{Local\_Mean}(i+1) = \text{Local\_Mean}(i) + \mu(\text{LocalLoopCount} - \text{Local\_Mean}(i)),$$

where i indicates an instant in time corresponding to a local loop count value and p is a scalar value.

9. A storage device, wherein the storage device comprises:
a storage medium; and
a data processing circuit, wherein the data processing circuit is operable to receive a data set derived from the storage medium, and wherein the data processing circuit includes:
a data decoder circuit, wherein the data decoder circuit is operable to receive a derivative of the data set and to provide a decoded output, and wherein the data decoder circuit is operable to process the derivative of the data set a plurality of times in sequence; and
a health detection circuit, wherein the health detection circuit is operable to receive an indication of a number of times that the data set is processed through the data decoder circuit, and wherein the health detection circuit is operable to generate an indirect health status of the storage medium based at least in part on the number of times that the data set is processed through the data decoder circuit.

10. The storage device of claim 9, wherein the health detection circuit includes a local loop counter that is operable to increment when the data set is processed through the data decoder circuit, and wherein the number of times that the data set is processed through the data decoder circuit is a local loop count value provided by the local loop counter.

11. The storage device of claim 10, wherein the indirect health status of the storage medium includes a mean of the local loop count value derived after processing a plurality of data sets.

12. The storage device of claim 9, wherein the data processing circuit further includes:
a data detector circuit, wherein the data detector circuit is operable to receive the data set and to provide a detected output, and wherein the derivative of the data set is a derivative of the detected output.

13. The storage device of claim 12, wherein the health detection circuit includes a global loop counter that is operable to increment when the data set is processed through a combination of the data detector circuit and the data decoder circuit, wherein a number of times that the data set is processed through the combination of the data detector circuit and the data decoder circuit is a global loop count value provided by the global loop counter; and wherein the indirect health status of the storage medium includes a mean of the global loop count value derived after processing a plurality of data sets.

14. A data processing circuit, the data processing circuit comprising:
a first data detector circuit, wherein the first data detector circuit is operable to perform a data detection on a first input data set at a first time and on a second input data set at a second time, and wherein the first input data set and the second input data set are derived from a storage medium;
a second data detector circuit;
a data decoder circuit, wherein the data decoder circuit is operable to receive a derivation of an output from the first data detector circuit corresponding to the first input data set, an output from the first data detector circuit corresponding to the second input data set, and a derivation of an output from the second data detector circuit; and wherein the data decoder circuit is operable to process a given data set a plurality of times in sequence;
wherein the second data detector circuit is operable to perform a data detection on the first input data set using an output of the data decoder circuit corresponding to the first input data set at a third time only if the output of the data decoder failed to converge, and wherein the third time is subsequent to the first time and to the second time; and
a health detection circuit, wherein the health detection circuit is operable to receive an indication of a number of times that the data set is processed through the data decoder circuit, and wherein the health detection circuit is operable to generate an indirect health status of the storage medium based at least in part on the number of times that the data set is processed through the data decoder circuit.

15. The data processing circuit of claim 14, wherein the health detection circuit includes a local loop counter that is incremented when the data set is processed through the data decoder circuit, and wherein the number of times that the data set is processed through the data decoder circuit is a local loop count value provided by the local loop counter.

16. The data processing circuit of claim 15, wherein the indirect health status of the storage medium includes a mean of the local loop count value derived after processing a plurality of data sets.

17. The data processing circuit of claim 16, wherein the mean of the local loop count value is calculated in accordance with the following equation:

$$\text{Local\_Mean}(i+1) = \text{Local\_Mean}(i) + \mu(\text{LocalLoopCount} - \text{Local\_Mean}(i)),$$

where i indicates an instant in time corresponding to a local loop count value and $\mu$ is a scalar value.

18. The data processing circuit of claim 14, wherein the health detection circuit includes a global loop counter that is incremented when the data set is processed through a combination of the data decoder circuit and one of the first data detector circuit and the second data detector circuit, and wherein a number of times that the data set is processed through the combination is a global loop count value provided by the global loop counter.

19. The data processing circuit of claim 18, wherein the indirect health status of the storage medium includes a mean of the global loop count value derived after processing a plurality of data sets.

20. The storage device of claim 19, wherein the mean of the global loop count value is calculated in accordance with the following equation:

$$\text{Global\_Mean}(i+1) = \text{Global\_Mean}(i) + \mu(\text{GlobalLoopCount} - \text{Global\_Mean}(i)),$$

where i indicates an instant in time corresponding to a global loop count value and $\mu$ is a scalar value.

\* \* \* \* \*